United States Patent [19] [11] 4,437,140
Ohyama et al. [45] Mar. 13, 1984

[54] PRINTED CIRCUIT DEVICE

[75] Inventors: Sadahiro Ohyama, Chigasaki; Hiroshi Kato, Machida; Sadao Yaguchi; Mikito Baba, both of Yokohama; Morikazu Okada, Atsugi, all of Japan

[73] Assignee: Mitsumi Electric Co. Ltd., Tokyo, Japan

[21] Appl. No.: 433,729

[22] Filed: Oct. 12, 1982

Related U.S. Application Data

[63] Continuation of Ser. No. 231,585, Feb. 3, 1981, abandoned, which is a continuation-in-part of Ser. No. 20,629, Mar. 14, 1979, abandoned.

[30] Foreign Application Priority Data

| Jun. 28, 1978 | [JP] | Japan | 53-77340 |
| Jul. 10, 1978 | [JP] | Japan | 53-83785 |
| Jul. 25, 1978 | [JP] | Japan | 53-90757 |
| Aug. 14, 1978 | [JP] | Japan | 53-111304[U] |
| Nov. 22, 1978 | [JP] | Japan | 53-144886 |
| Dec. 4, 1978 | [JP] | Japan | 53-149075 |
| Dec. 4, 1978 | [JP] | Japan | 53-149074 |

[51] Int. Cl.³ .......................................... H05K 01/18
[52] U.S. Cl. ........................ 361/402; 174/68.5; 427/96
[58] Field of Search ............... 174/68.5; 361/402; 427/96

[56] References Cited

U.S. PATENT DOCUMENTS

| 1,647,474 | 11/1927 | Seymour | 174/68.5 |
| 3,317,653 | 5/1967 | Layer | 361/402 X |
| 3,368,116 | 2/1968 | Spaude | 361/402 |
| 3,549,784 | 12/1970 | Hargis | 174/68.5 |
| 3,622,384 | 11/1971 | Davey | 174/68.5 X |
| 3,714,709 | 2/1973 | Liederbach | 29/626 |
| 4,214,212 | 7/1980 | Dipietromaria | 361/402 X |
| 4,301,324 | 11/1981 | Kumar | 174/68.5 |

Primary Examiner—R. R. Kucia
Attorney, Agent, or Firm—Anthony H. Handal

[57] ABSTRACT

A printed circuit device comprises a ceramic base plate and a circuit pattern layer which is constituted of electric conductor layers and insulating layers in alternate laminar stacked arrangement on one surface of the base plate, which layers are formed by alternately printing electrically conductive material and insulating material in predetermined patterns and subjecting the material thus printed to baking. Among the electric conductor layers, at least one layer serves as a wiring or conducting layer. At least two electric conductor layers confronting each other with the insulating layer interposed therebetween constitute a capacitor. Resistors are formed in the circuit pattern layer by printing the material of the resistor on an electrode layer applied beforehand to the surface of the electric conductor layer. Further, when required, circuit elements with lead terminals such as coils are disposed on one side of the base plate with the lead terminals thereof passed through the base plate and the circuit pattern layer to project from the other side, the projected part of the lead terminal being fixed to the opposite side of the base plate.

9 Claims, 25 Drawing Figures

PRINTED CIRCUIT DEVICE

CROSS REFERENCE TO RELATED APPLICATIONS

This application is a continuation of U.S. Ser. No. 06/231,585, filed Feb. 3, 1981 now abandoned, which, in turn, is a continuation of U.S. Ser. No. 06/20,629, filed Mar. 14, 1979 also now abandoned.

BACKGROUND OF THE INVENTION

The present invention relates generally to printed circuit devices such as printed circuit boards and printed circuit assemblies, and more particularly to a printed circuit device wherein circuit parts are, as far as possible, formed by a printing process wherein wiring or conducting layers and capacitors are fabricated by alternately printing electric conductor layers of molybdenum paste or the like and insulating layers, whereby there is realized a reduction in the number of fabricating steps and improvement of performance.

Conventional printed circuit devices, such as those used in the tuner units of television receivers, are generally constructed with the individual electrical components such as capacitors, resistors, coils, inductors and transistor chips disposed on one surface of a printed circuit board, the components being attached to the board by inserting the wire lead terminals thereof into the board and then dip-soldering the terminals. This structural arrangement gives rise to problems in that unrequired oscillation and stray capacitance inevitably develop across the component lead terminals thus deteriorating the performance of the circuit. Moreover, there arises another problem in that circuit components with lead terminals are rather expensive and further make the fabrication work more troublesome.

SUMMARY OF THE INVENTION

It is a general object of the present invention to provide a novel and useful printed circuit board and assembly in which the above described difficulties have been overcome.

Another and specific object of the invention is to provide a printed circuit device in which, after a capacitor has been made by printing on a base plate, an insulating layer having a flat upper surface is formed to cover the capacitor, and then a resistor is print-formed on the surface of the insulating layer. The thickness of the resistor is accordingly made uniform throughout thus liminating the need to adjust the resistor after it has been attached and further improving the performance of the printed circuit device.

Still another object of the present invention is to provide a printed circuit device in which the conducting layer electrically connected to power supply terminals is covered with an electric conductor layer having ground electric potential with an insulating layer interposed therebetween, thus forming the equivalent of a low-pass filter so that unwanted high-frequency signals generated by the circuit are effectively removed, thus further improving the performance of the printed circuit device.

Other objects and further features of the invention will be apparent from the following detailed description with respect to preferred embodiments of the present invention when read in conjunction with the accompanying drawings.

BRIEF DESCRIPTION OF THE DRAWING

In the drawings:

FIG. 12 is a fragmentary bottom view of a fourth embodiment of the printed circuit device which can be applied to the television receiver tuner unit;

FIGS. 13, 14 and 15 are vertical sectional views respectively taken along the lines C—C, D—D, and E—E in FIG. 12, as viewed in the arrow direction;

DETAILED DESCRIPTION OF THE INVENTION

Figure 1:
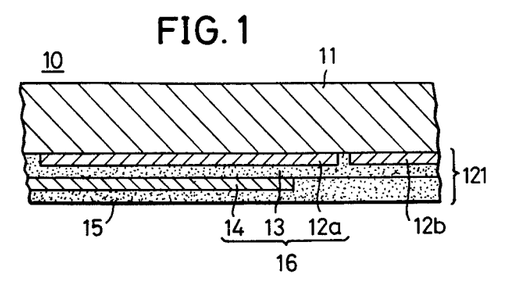
FIG. 1 is a vertical section of a first embodiment of a printed circuit device according to the present invention.

Referring now to FIG. 1, the structural arrangement of a first embodiment of the printed circuit device according to the present invention is first described.

A printed circuit device (a printed circuit board) 10 comprises a ceramic base plate 11 and a circuit pattern layer 121 attached thereto. The base plate 11 is made in the desired shape by punching from a flexible unbaked sheet. Electric conductor layers 12 (12a and 12b) are printed and formed on the lower surface of the base plate 11 in a predetermined thickness and specific pattern with, for example, molybdenum paste material. Then, an insulating layer 13 is printed and formed on the surface of the electric conductor layers 12 with ceramic material. Thereafter, in a similar manner, an electric conductor layer 14 and an insulating layer 15 are sequentially printed and formed. Finally, the whole structure is subjected to baking at a temperature between 1,600° C. and 1,800° C. in a reducing atmosphere. As a result of this baking, the base plate 11 is hardened and the above described layers 12a, 12b, and 13 through 15 are stabilized thus forming the circuit pattern layer 121.

The pair of electric conductor layers 12a and 14, and the insulating layer 13 sandwiched therebetween constitute a capacitor 16. The electric conductor layer 12b serves as a wiring or conducting layer for another circuit. The advantages of the capacitor 16 over a conventional capacitor with lead terminals are that it reduces the number of processes for providing a capacitor on a base plate and improves performance by eliminating the possibility of unwanted oscillation and stray capacitance across the lead terminals.

The molybdenum paste material of the electric conductor layers 12 (12a, 12b) and 14 is composed of molybdenum metal powder having a melting point of 2615±5° C. and the specific electric resistance of 5.2 $\mu\Omega cm$, talc (also referred to as steatite and consisting of MgO, CaO, and $SiO_2$), and sodium glass, and is formed to be a paste-like mixture by kneading with a suitable binder. The material of the electric conductor layers 12 and 14, however, is not limited to molybdenum paste, but may be a tungsten paste using tungsten metal powder having a melting point of 3,380° C. and the specific electric resistance of 4.9 $\mu\Omega cm$, instead of the molybdenum powder in the above described composition, or a molybdenum-tungsten paste wherein molybdenum powder and tungsten powder are mixed. Furthermore, there may be used a paste obtained by adding a small amount of some other metal having a high melting point and low specific electric resistance such as platinum to any of the above described paste components. The above described pastes are low in cost compared with the silver paste which has conventionally been used for electric conductor layers such as layers 12 and 14. The molybdenum or tungsten of the paste used adheres to the base plate 11 and the insulating layer 13 with large bonding force, thus improving the quality of the printed circuit device. This can also be said of all of the other materials used in the electric conductor layers of the following embodiments.

Next, the structure and method of fabrication of a second embodiment of the printed circuit device will be described in conjunction with FIGS. 2A through 4B.

Figure 2A:
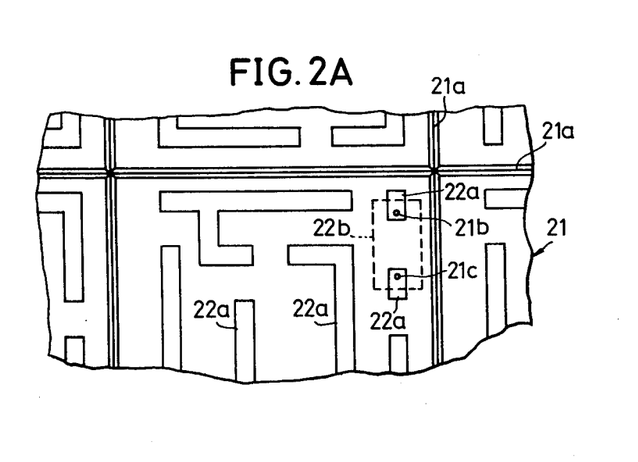
FIGS. 2A and 3A are fragmentary plan views of a partially completed second embodiment of the printed circuit device according to the present invention in the first and second stages of fabrication.

For manufacturing a printed circuit device (a printed circuit assembly) 20, an appropriately shaped unbaked sheet of ceramic material base plate 21 is pressed to form V-shaped grooves 21a thereon so as to make the sheet easy to devide into separate printed circuit boards. The grooves 21a extend in the vertical and lateral directions, thus forming a lattice pattern, whereby the base plate 21 is divided into a plurality blocks. Then, by way of example, a pair of through-holes 21b and 21c may be punched in each block.

Figure 2B:
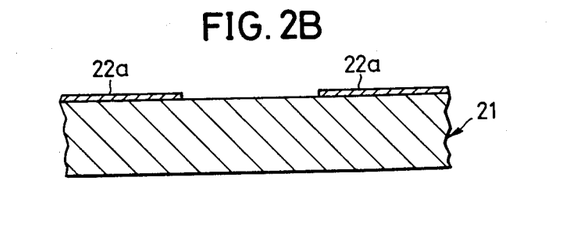
FIGS. 2B and 3B are enlarged vertical sectional views showing the principal part of the partially completed device indicated in FIGS. 2A and 3A.
Figure 4A:
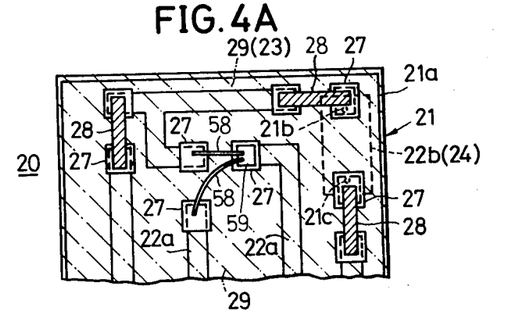
FIG. 4A is a fragmentary plan view showing the second embodiment of the printed circuit device of the present invention in its completed state.
Figure 4B:
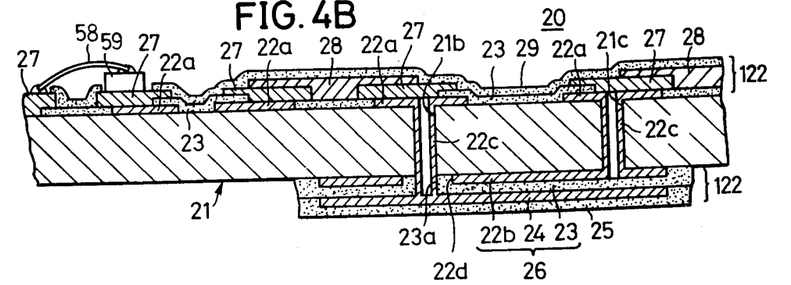
FIG. 4B is an enlarged vertical section showing the principal part of the second embodiment of the printed circuit device.

Next, molybdenum paste is printed in a film state on both surfaces of the base plate 21, thereby forming a plurality of electric conductor layers 22 (including conducting layers 22a, electrode layer 22b, and through-hole layers 22c). The base plate 21 thus printed and formed is subjected to semi-drying. The electrode layer 22b helps to form a capacitor 26 described hereinafter and, as shown in FIG. 4B, is electrically connected to the conducting layer 22a at the right upper side of the base plate 21 by way of the through-hole layer 22c formed around the inner surface of the through-hole 21c. The electrode layer 22b is formed with an opening 22d around the left-side through-hole 21b, thus being electrically separated from the conducting layer 22a in the vicinity of the through-hole 21b.

Figure 3A:
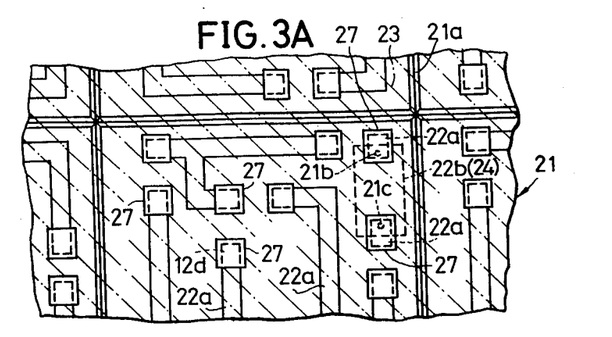
Figure 3B:
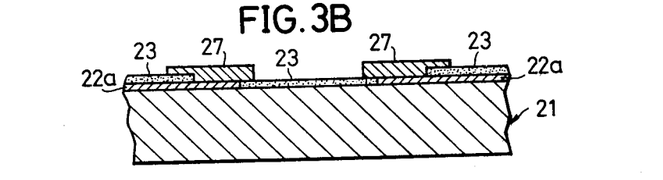

Then, as illustrated in FIGS. 3A and 3B, ceramic paste is printed over the whole of the upper surface of the base plate 21 and the conducting layer 22a except for certain predetermined parts of the conducting layer 22a which are left exposed, thus forming a first insulating layer 23. This insulating layer 23 serves to protect the above described electric conductor layer from oxidation at the time of oxidation baking treatment described hereinafter. The insulating layer 23 need not necessarily be formed at the part where a resistor 28 (to be described later) is to be printed and formed, and the resistor 28 may be provided in direct contact with the upper surface of the base plate 21.

Simultaneously, the first insulating layer 23 is similarly printed to a thickness of about 30 $\mu m$, for example, onto the electrode layer 22d on the lower surface of the base plate 21, as indicated in FIG. 4B. An opening 23a is left in this insulating layer 23 at a position within the above-mentioned opening 22d coinciding with the left-side through-hole 21b. The base plate 21 thus printed on its upper and lower surfaces with the first insulating layer 23 is subjected to semi-drying.

After the base plate 21 has been semi-dried, an electrode layer 24 is further printed on the surface of the insulating layer 23 on the lower surface of the base plate 21 so as to be electrically connected to the conducting layer 22a at the upper surface of the base plate 21 by way of the through-hole layer 22c.

Then, ceramic paste is further applied to form a second insulating layer 25, thus completing a capacitor 26 which is constituted of the pair of conducting layers 22a, the electrode layers 22b and 24, and the first insulating layer 23 as the dielectric layer. A capacitor having large capacitance can be fabricated in this way by increasing the number of electrode layers to three or more instead of the two layers just described.

Here, since the molybdenum (or tungsten, or molybdenum-tungsten mixture) used is available at low cost, the capacitor 26 can be manufactured cheaply. The larger the number of layers provided the cheaper the capacitor 26 is to fabricate in comparison with a conventional capacitor of corresponding capacitance. Moreover, the area and the number of the electrode layers can be easily changed so that the capacitance of the capacitor can be set at any value over a relatively large range.

Instead of using the above mentioned molybdenum, tungsten, or molybdenum-tungsten mixture as the material of the capacitor 26, it is also possible to use tungsten carbide, a substance having resistance to oxidation. Tungsten carbide, however, cannot be used as the conducting layer 22a because of its low electric conductivity.

In the next step the base plate 21 is subjected to baking at a temperature ranging from 1,600° C. to 1,800° C. in a reducing atmosphere. Accordingly, the base plate 21 is hardened and, simultaneously, the electric conductor layer 22 and the insulating layers 23 and 25 are stabilized.

Then, silver or silver-palladium paste is selectively printed the exposed end part of the conducting layer 22a on the upper side of the base plate 21 to form an electrode part 27 as indicated in FIGS. 3A and 3B. The material for forming the electrode part 27 is not limited to silver or siler-palladium and other materials such as silver or platinum paste may be used. The silver printed as the electrode part 27 diffuses into the molybdenum. Therefore, the bonding force between the electrode part 27 and the conducting layer 22 becomes extremely strong and stable, and, moreover, the electric resistance value between their contacting surfaces is advantageously restricted to an extremely low value. The electric conductor layers 22 (22a through 22c) are now completely shielded from the atmosphere, and are thereby protected from oxidation.

Then, the base plate 21 is subjected to oxidation baking at a temperature of 800° C., for instance, whereby the electrode part 27 is stabilized. Following this, a paste of a resistance material is applied across each pair of electrode parts 27 thereby to form resistors 28, as indicated in FIGS. 4A and 4B. Then, the base plate 21 thus coated is again subjected to baking in an oxidation atmosphere to stabilize the resistors 28. The base plate 21 is now snapped off along the grooves 21a, and a large number of printed circuit devices having the shape indicated in FIG. 4A are thereby obtained. It should be noted, however, that the fabrication process is not limited to the above process wherein oxidation is carried out twice. It is also possible to use a method wherein, after the electrode parts 27 and resistors 28 have been formed, the oxidation baking is carried out only once thereby to stabilize both of the electrode parts 27 and the resistors 28 simultaneously.

Whichever method is used, a coating layer 29 is thereafter formed over the entire printed structure except for the transistor connection parts, thus completing circuit pattern layers 122.

Thereafter, as indicated in FIGS. 4A and 4B, a transistor 59 is bonded by its collector to a specific electrode part 27 with electrically conductive adhesive in an electrically conducted state. The base and emitter of the transistor 59 thus bonded are respectively connected to the other electrode parts 27 by way of lead wires 58 by ultrasonic bonding. This completes the fabrication of the printed circuit device 20.

Moreover, pin-shaped terminals (not shown) are soldered to terminal connection parts of the electric conductor layer 22, and thereafter, the device 20 is entirely covered with synthetic resin or the like to seal it from the atmosphere.

Figure 5:
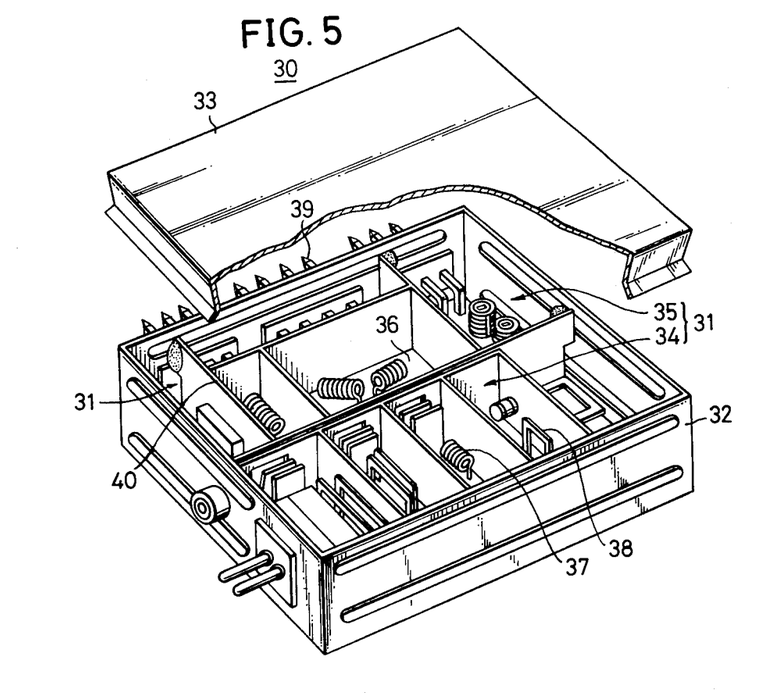
FIG. 5 is a perspective view showing an embodiment of a television receiver tuner unit using a third embodiment of the printed circuit device according to the present invention.

FIG. 5 shows a television receiver tuner unit 30 employing a third embodiment of the printed circuit device of this invention. The tuner device 30 substantially comprises a metallic casing 32, a printed circuit device (a printed circuit assembly) 31 fixed to the bottom of the metallic casing 32, and a metallic cover 33 covering the top of the casing 32. The printed circuit device 31 is divided into a section 34 for UHF tuning and another section 35 for VHF tuning. The base plate 36 of the printed circuit assembly 31 has, on its lower surface, a circuit pattern layer 123 (shown in FIG. 6 and described below) and, on its upper surface, such circuit elements incapable of being formed in luminar structure as coils 37, inductors 38 and L-shaped power supplying terminals 39 as well as shielding plates 40. These circuit elements are attached to the base plate 36 by leads after the circuit pattern layer 123 has been formed.

The process for fabricating the printed circuit assembly 31 will now be described with reference to FIGS. 6, 7 and 8. Molybdenum paste is first applied on the lower surface of the base plate 36 thereby to form an electric conductor layer 41 comprising an electric conductor layer 41a in the shape of a flattened figure "8" for grounding, and conducting layers 41b.

Figure 7:
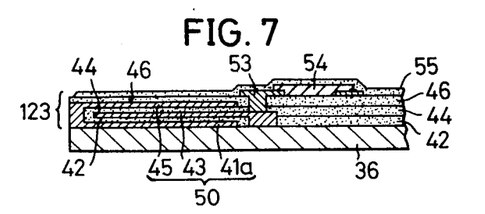
FIG. 7 and FIG. 8 are vertical sections respectively taken along the line A—A and the line B—B in FIG. 6, as viewed in the arrow direction.
Figure 8:
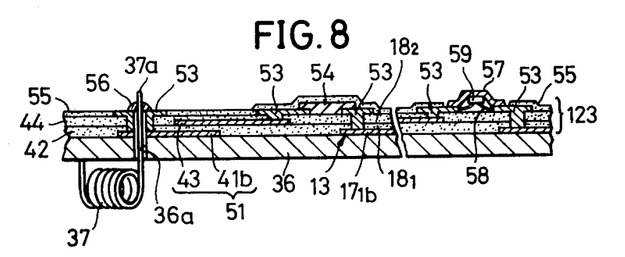

Then, a first insulating layer 42 is formed over substantially the entire surface of the base plate 36, including the above described electric conductor layer 41, as indicated in FIGS. 7 and 8. The surface of the first insulating layer 42 is flat throughout, even in those areas where it covers the electric conductor layers 41 (41a, 41b). A flat surface can easily be obtained in spite of the irregularity of the underlying surface since the thickness of the insulating layer 42 is made much greater than the thickness of the electric conductor layer 41 and since the ceramic material from which the layer is formed has some degree of fluidity. Once the base plate 36 has been coated with the insulating layer 42 it will form a flat surface of its own accord if left in a still state. The insulating layers described hereinafter are similarly formed to be of flat surface.

Next, electric conductor (or conducting) layers 43 are printed at the parts corresponding to capacitors 50, 51, and 52 described hereinafter. Furthermore, a second insulating layer 44 is then applied or printed over the entire area of the base plate 36.

Figure 6:
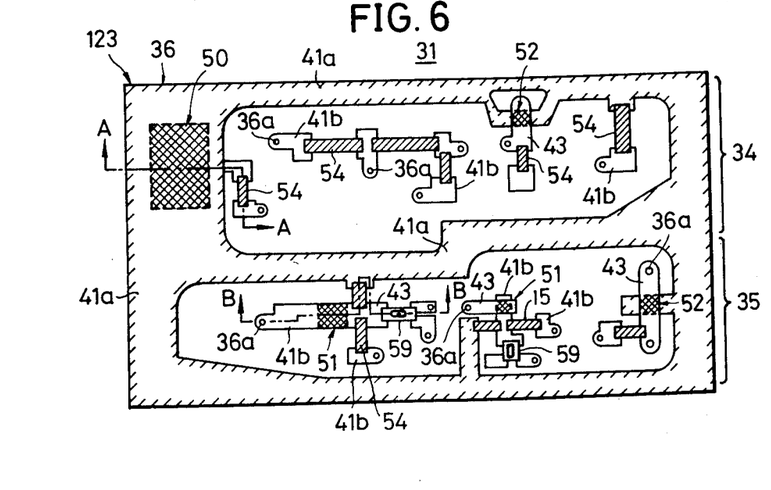
FIG. 6 is a bottom view of the printed circuit device indicated in FIG. 5.

Next, a second grounding electric conductor layer 45 is formed, as indicated in FIG. 7, only at a part corresponding to a large-capacitance capacitor 50 located on the base plate 36 as indicated in FIG. 6. The first and second grounding electric conductor layers 41a and 45 are electrically connected so that in use both assume ground potential. Then, a third insulating layer 46 is applied or printed on the surface of the above mentioned second grounding electric conductor layer 45. At this stage of fabrication, the structure is subjected to reduction baking. As a result, there are formed a capacitor 50 consisting of the three electric conductor layers 41a, 43, and 45 as shown in FIG. 7, a capacitor 51 consisting of two electric conductor layers 41b and 43 as indicated in FIG. 8, and another capacitor 52 (FIG. 6) consisting of two electric conductor layers 41a and 43.

Then, as illustrated in FIG. 3 through FIG. 7, silver or silver-palladium paste is applied to the insulating layers 44 and 46 in such a manner that it is electrically connected with specific parts of the electric conductor layers 41b and 43, thus forming electrode parts 53. Thereafter, resistors 54 are printed accross specific electrode parts 53, as illustrated in FIG. 6 through FIG. 8, and the entire structure is then subjected to oxidation baking. Finally, a protection coating layer 55 made of synthetic resin or glass is applied over the whole area of the common base 36 except those parts where coils 37 and transistors 53 are to be attached, as indicated in FIG. 8, whereby a circuit pattern layer 123 is completed.

In the above described structural arrangement, the surfaces of the insulating layers 44 and 46 are made flat over the entire area of the base plate 36 before the resistor 54 is to be printed. Therefore, the resistor 54 is formed with uniform thickness without any undesired increase or decrease in thickness at the edge parts thereof and therefore exhibits good electric characteristics. The present inventors actually formed and measured the characteristics of the resistor 54. In the device concerned, the insulating layers 42, 44, and 46, which were formed over the entire area of the base plate 36, had a dielectric constant of $\epsilon \div 10$. The measurement showed that the resistor 54 can be produced with as great of accuracy in its resistance value as can a resistor which is directly printed the upper surface of the base plate 36. Therefore, the resistor 54 thus formed does not need any width-size adjusting operation after it has been applied or printed so that the cost of fabrication is reduced.

After the circuit pattern layer 123 has been completed, the lead terminals 37a of the coils 37 etc are inserted into through-holes 36a of the base plate 36 so as to pass completely therethrough and project from the other side. The projecting ends are then fixed by dip-soldering so as to be electrically connected with the electrode part 53 by a mass of solder 56, as indicated in FIG. 8. Other electric parts 38, 39, and 40 are fixed in a similar manner. Furthermore, as indicated in FIG. 6 and FIG. 8, a transistor chip 59, which is accommodated within a ceramic cap 57 and has three lead wires 58 connected to respective electrode parts (not shown) of the cap 57, is electrically connected to three electrode parts 53. Mounting of the transistor 59 in an electrically conductive manner is carried out by placing the cap 57 on the electrode part 53 with the electrode part of the cap 57 confronting soldering paste applied to the electrode part 53 beforehand, and then by subjecting it to soldering operation at a relatively low temperature. This completes the printed circuit device 31.

Figure 11:
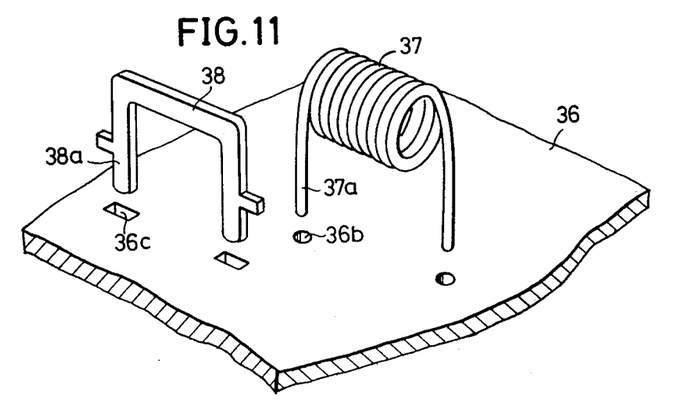
FIG. 11 is an enlarged perspective view showing a ceramic base plate and circuit elements with lead terminals mounted thereto in the printed circuit device indicated in FIG. 5.

FIG. 11 shows how the coils 37 and the inductors 38 are mounted on the ceramic base plate 36. The lead terminals 37a of the coil 37 are circular in cross section, and the lead terminals 38a of the inductor 38 are rectangular in cross section. Accordingly, the base plate 36 is formed with circular holes 36b and rectangular holes 36c. Because of the mechanical properties of the base plate 36, cracks may appear at the corners of perfectly rectangular holes and it is therefore better to round the corners of the rectangular holes or to use holes having an eliptical cross section.

The characteristics of the above-described capacitors 50, 51, and 52 will now be described.

Figure 9:
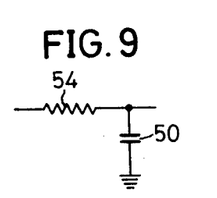
FIG. 9 and FIG. 10 are circuit diagrams of the equivalent circuits of the portions of the printed circuit device indicated in FIGS. 7 and 8.
Figure 10:
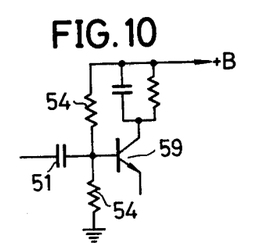

The capacitor 50 comprises the electric conductor layer 43 and the pair of ground electric conductor layers 41a and 45 positioned above and below the layer 43, as illustrated in FIG. 7. Accordingly, the capacitor 50 has large capacitance and functions as a capacitor connected to ground as shown in the equivalent circuit in FIG. 9. Capacitor 51 is formed of a pair of confronting electric conductor layers 41b and 43 as indicated in FIG. 6 and FIG. 8. This capacitor is used as a coupling capacitor for the transistor 59 as indicated in FIG. 10. Capacitor 52 is formed of the electric conductor layers 41a and 43 as indicated in FIG. 6, and is used in an oscillation circuit. The above described film-like capacitors 50, 51 and 52 and the resistor 54 do not have any lead terminals. They are therefore superior to conventional capacitors and resistors which have lead wires which generate unwanted inductance.

FIG. 12 is a bottom view, showing, in part, a fourth embodiment of the printed circuit device applied to the tuner device 30 of FIG. 5. Similarly to the printed circuit device 31 shown in FIG. 6, the ceramic base plate 61 of printed circuit device 60 has a circuit pattern layer 124 (FIG. 13) on its lower surface which is divided into a UHF tuning section 34 occupying the top half of the base plate 61 and a VHF tuning section 35 occupying the lower half thereof in FIG. 12. This arrangement is designed to prevent unwanted high-frequency waves generated in the UHF section 34 from reaching and adversely affecting other parts of the circuit.

Firstly, on the lower surface of the base plate 61, is formed an electric conductor layer 62 which consists of a first ground electric conductor layer 62a and a conducting layer 62b. Then, an insulating layer 63, an electric conductor layer 64, an insulating layer 65, and a second ground electric conductor layer 66 are sequentially printed in laminar stacked arrangement on the first grounding electric conductor layer 62a at a specific positions thereon, as illustrated in FIG. 12 through FIG. 15. Resistors 67 are printed on the surface of the conducting layer 62b by way of the insulating layer and an electrode part 68 described hereinafter. Each of the plurality of electric conductors 64 is connected at one end thereof to a power supply terminals 39 by way of the electrode part 68 and a mass of solder 69, as indicated in FIG. 15, and at the other end thereof to the conducting layer 62b of the UHF tuning section 34 or the VHF tuning section 35 as shown in FIG. 12. Moreover, the pair of grounding electric conductor layers 62a and 66 which lie above and below the electric conductor layer 64 form a plurality of connection lines 70a through 70d.

Among the plurality of electric conductor layers 64, those connecting the power supply terminals 39 and the UHF tuning section 34 have an intermediate wide part 64a. The corresponding wide parts 64b in the electric conductor layers connecting the power supply terminals 39 and the VHF tuning section 35 are provided in the vicinity of the power supply terminals 39 in view of the shorter distance between the terminal and the tuning section. Accordingly, the connection lines 70a through 70i respectively constitute capacitors 71a and 71b at the above-described wide parts 64a and 64b.

Figure 16:
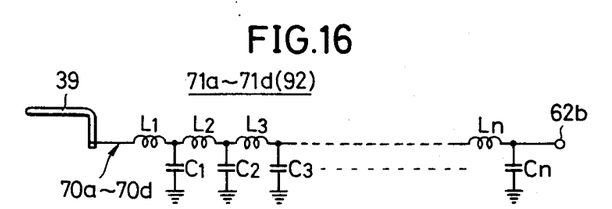
FIG. 16 is a circuit diagram showing the equivalent circuit of a low-pass filter included in the printed circuit device illustrated in FIG. 12.

The equivalent circuit of the structural arrangement set forth above is shown in FIG. 16. Specifically, the inductance of the connection lines 70a through 70d can be represented by n number of coils designated $L_1$ through $L_n$ and the wider parts 64a and 64b of the electric conductor layer 64 constitute, together with the pair of grounding electric conductor layers 62a and 66 lying above and below the wider parts 64a and 64b, an equal number of capacitors C1 through Cn (the total of capacitance of the capacitors being, for example, on the order of 200 to 1,000 FF). Therefore, each of the connection lines 70a through 70d constitutes the equivalent of a series of low-pass filters 71a through 71d.

Figure 17:
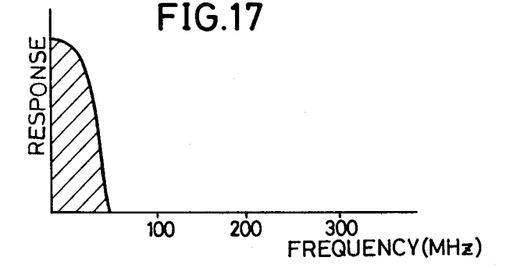
FIG. 17 is a graph showing the characteristics of the low-pass filter illustrated in FIG. 16.

As a result, the unwanted part of the high-frequency signal generated in the conducting layer 62b in the UHF and VHF tuning sections 34 and 35, i.e. the part of the high-frequency signal other than the part indicated by hatching in FIG. 17, is cut off and thereby prevented from reaching the power supply terminals 39. Therefore, the possibility of any deleterious effect arising from the external radiation of the high-frequency wave from the power supply terminal 39 is effectively prevented. Moreover, intermodulation between the connection lines 70a through 70d, and unwanted radiation are substantially prevented by the shield effect of the grounding electric conductor layers 62a and 66 and the performance of the tuner device 30 is improval accordingly. Moreover, since the low-pass filters 71a through 71d themselves are formed by printing and are thus very thin, they can be built into with no substantial increase in its size.

Figure 18A:
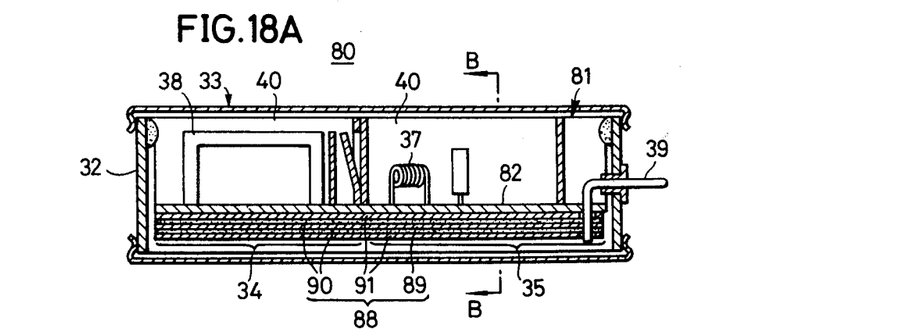
FIGS. 18A and 18B are a side view and a fragmentary front view, both in vertical section, showing another embodiment of a television receiver tuner unit to which a fifth embodiment of the printed circuit device of the present invention is applied.
Figure 18B:
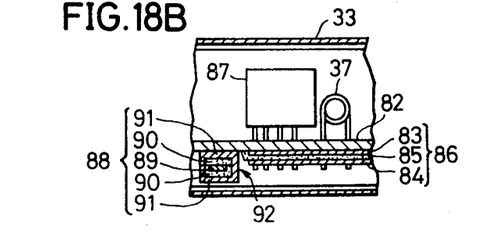

FIGS. 18A and 18B show a tuner device 80 to which a fifth embodiment of the printed circuit device of the present invention is applied. Parts in FIGS. 18A and 18B which correspond to parts of the above described tuner device 30 are designated by like reference numerals. On the lower surface of the ceramic base plate 82 of the printed circuit device 81 installed in the tuner unit 80, a circuit pattern layer 86 consisting of, for example, a pair of electric conductor layers 83 and 84, and an insulating layer 85 is printed to be in electrical connection with a coil 37, an integrated circuit 87, and the like which are positioned above the base plate 82. Moreover another circuit pattern layer, namely a connecting line 88, is also print-formed on the common base 82. The connecting line 88 is formed by alternately printing electric conductive and insulating layers on the lower surface of the base plate 82 so as to produce a conducting layer 89 enveloped by an insulating layer 90 and further by grounding electric conductor layers 91. One end of the conducting layer 89 is electrically connected to a power supply terminal 39 and the other end is electrically connected to a circuit part (not shown) of the UHF tuning section 34. Thus, similarly as in the preceding case of the printed circuit device 61, a low-pass filter 92 comprising the equivalent of n coils ($L_1$ through $L_n$) and n capacitors ($C_1$ through $C_n$) is constituted between the power supply terminal 39 and the circuit part (not shown), as indicated in FIG. 16. Similar to the low-pass filters 71a through 71d, this low-pass filter 92 also operates to cut off the unwanted high-frequency signal component, namely the part of the signal other than that indicated by hatching in FIG. 17, thus preventing unwanted signal radiation.

In both the printed circuit device 31 shown in FIG. 6 and the printed circuit device 81 shown in FIG. 18A, the power supply terminal 39 and the UHF tuning section 34 are disposed on opposite sides of the VHF tuning section 35 so as to separated by a long distance. Accordingly, the unwanted high-frequency signal radiated into the air by the circuit elements of the UHF tuning section 34 is not picked up to any appreciable extent by the power supply terminal 39 and high frequency radiation from the power supply terminal 39 is further prevluded in this manner.

Figure 19:
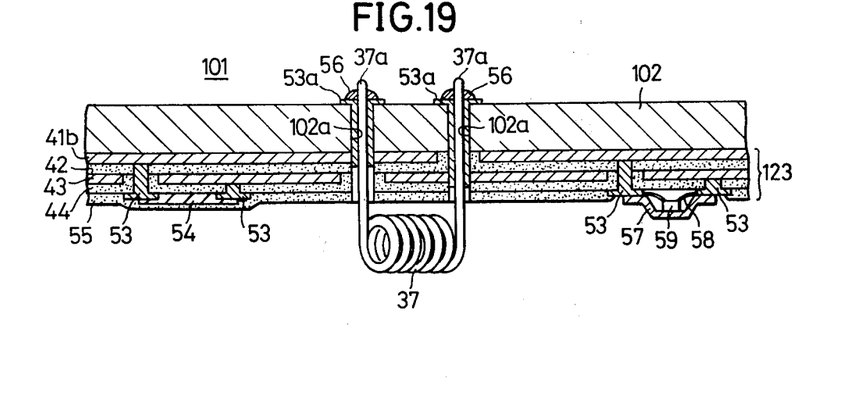
FIG. 19 is a vertical section showing a sixth embodiment of the printed circuit device of the present invention.

FIG. 19 shows a sixth embodiment of the printed circuit device. Parts in FIG. 19 which correspond to parts in FIG. 8 are designated by like reference numerals. (Note that the printed circuit devices in FIG. 8 and FIG. 19 are shown upside down.) Referring to FIG. 19, the holes 102a in the ceramic base plate 102 of the printed circuit device 101 are provided with cylindrical printed electrode parts 53a in the shape of through-holes at the same time that the electrodes 53 are formed on the lower surface of base plate 102. The coil 37 is supported on the base plate 102 with its lead terminals 37a electrically connected to the electrode parts 53a by solder 156. This coil 37 is fitted by inserting its lead terminals 37a through the hole 102a and then soldering the lead tips projecting from the opposite surface. As the dip-soldering of the lead terminals 37a of the coil 37 and likewise of the lead terminals of all other circuit elements having leads is performed at points on the at their upper surface of the common base 102, the transistor chip 59 on the lower side is effectively protected from exposure to excessive heat by the heat insulating effect of the common base 102. Accordingly, the method of this invention is more effective in preventing the degradation of transistor performance by exposure to heat than is the conventional process wherein the soldering operation is performed on the transistor side of the base plate. (The adverse effect of heat on the transistor 59 may also be precluded by attaching the transistor after the dip-soldering operation has been completed but this gives rise to a limitation in terms of the manufacturing processes.) Unwanted signal coupling between the coil 37 and the transistor 59 can be easily prevented by providing a shield plate (not shown) on the lower surface of the printed circuit device between these two elements. (Here, if the coil structure 37 is disposed on the upper surface side of the base plate 102, it becomes difficult to dispose the shield plate along a line connecting the coil 37 and the transistor and as a consequence signal coupling is liable to take place.) Moreover, all of the circuit elements with lead terminals are disposed on the lower surface side of the base plate 102. Accordingly, when the printed circuit assembly 101 is placed on the assembling base, with the upper side surface of the base plate 102 confronting the assembling base, during the fabricating processes, damage to the circuit elements can be effectively prevented.

Figure 20A:
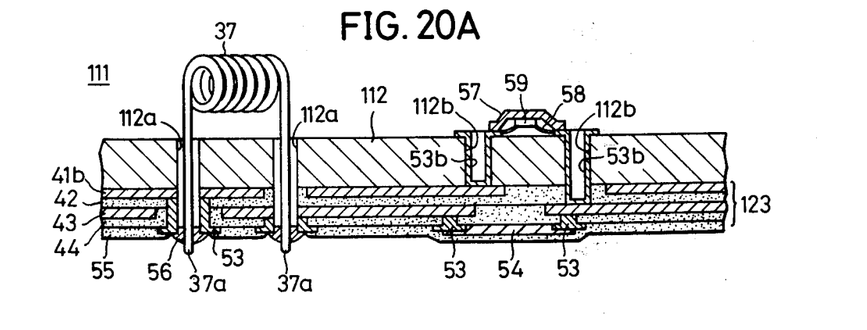
FIGS. 20A and 20B are vertical sections showing seventh and eighth embodiments of the printed circuit device according to the present invention.
Figure 20B:
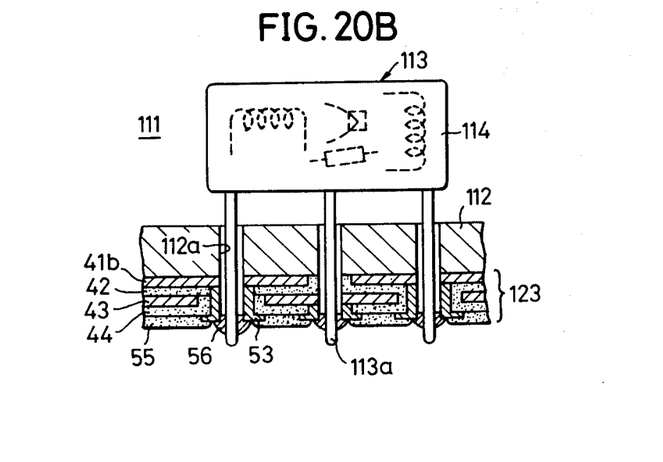

FIGS. 20A and 20B show seventh and eighth embodiments of the printed circuit device according to the present invention. Parts in FIGS. 20A and 20B which are the same as the parts in FIG. 19 are designated by like reference numerals. Referring to FIGS. 20A and 20B, the ceramic base plate 112 of the printed circuit device 111 is formed with a pair of holes 112a, and three other holes 12b (only two holes being shown). The electrode part 53 on the lower surface of the base plate 112 and the cylindrical electrode part 53b of the holes 112b are printed simultaneously. The lead terminals 37a of the coil 37 are inserted through the holes 112a from the upper side of the base plate 112 and the tips thereof are electrically connected to the pair of electrode parts 53 on the lower surface of the base plate 112 by the solder parts 56 applied in the succeeding dip-soldering operation. The leads of the transistor 59 are electrically connected to the three electrode parts 53b at the upper surface of the base plate 112. Accordingly, the transistor 59 at the upper surface of the base plate 112 is not affected by heat when the lower side of the base plate 112 is subjected to the dip-soldering operation thus precluding, deterioration of the performance of the transistor by excessive heat. Moreover, the printed circuit device 111 has such elements as the coil 37 and the transistor 59 disposed on the upper surface of the base plate 112, similar to the device 101. Accordingly, a shield plate can be disposed at the most effective position and damage to the elements during the fabricating processes can be obviated.

In FIG. 20B, a circuit block 113 is shown mounted on the upper surface of the base plate 112. This circuit block 113 is constructed in substantially the same manner as the above-described printed circuit device 20, that is to say by fitting such parts as coils, resistors, capacitors and transistors to an electric conductor pattern ormed on a rectangular ceramic base plate 114 and then covering the entire structure with synthetic resin. The circuit block 113 contains transistors and is therefore sensitive to heat. This circuit block 113 is disposed on the upper surface side of the base plate 112, similar to the above described transistor 59, and terminals 113a thereof are inserted through the base plate 114 to project from the lower surface thereof. The terminals 113a projecting from the lower surface of the base plate 114 are then dip-soldered. When the dip-soldering operation is carried out, the circuit block 113 is not exposed to the soldering heat so that the transistors thereon do not suffer any deterioration in their performance.

In the printed circuit assembly 111, the lead terminals of the circuit parts 37, 57, and 113 are electrically connected perpendicularly to one or the other of the electric conductor layers 41b and 43. The wiring arrangement is thus made three dimensional with a corresponding increase in wiring density and miniaturization of the printed circuit device.

The electrode part 53b for attachment of the transistor 59 in FIG. 20A is formed by printing silver or silver-palladium paste directly on the base plate 112. The electrode part 53b is, however, not limited to this structure. It may also be formed by first coating the inside surface of the hole 112b with molybdenum paste to form a cylindrical electric conductor layer which is the same shape as that of the electrode part 53b and then applying a flat larger of silver or silver-palladium paste over the upper surface of the cylindrical electric conductor layer.

A chip-formed diode, resistor, capacitor or the like can be attached to the printed circuit board in place of the transistor 59 shown in FIGS. 19 and 20A. (When a resistor or capacitor replaces the transistor 59, the cap 57 is not required.) Here, the term "chip-formed" is used to described the shape of any circuit part whose lead terminals are too short to pass completely through the base plate 102 or 112. The coil 37 may similarly be replaced by another circuit part having lead terminals such as an inductor, transistor, resistor, or capacitor.

Further, this invention is not limited to these embodiments but various variations and modifications may be made without departing from the scope of the invention.

What is claimed is:

1. A printed circuit device comprising:
 a ceramic base plate; and
 a circuit pattern layer disposed on one surface of said base plate, said circuit pattern layer comprising a plurality of electric conductor layers and insulating layers in an alternate stacked laminar-arrangement, said
 electric conductor layers and said insulating layers each having a predetermined pattern, a predetermined part of said circuit pattern being constituted by a first conductor layer, an intermediate conductor layer, a second conductor layer, a first insulating layer, and a second insulating layer,
 said intermediate conductor layer being stacked adjacent said first insulating layer on one surface thereof and being stacked adjacent said second insulating layer on the other surface thereof, said first insulating layer being stacked with said first conductor layer, said second insulating layer being stacked with said second conductor layer,
 said first and second insulating layers being connected and forming an insulating enclosure which is disposed around intermediate conductor layer in a cross section taken along a plane perpendicular to the surface of the base plate,
 said first and second conductor layers being connected and forming a conductor enclosure disposed around said insulating enclosure in said cross section,
 said intermediate conductor layer forming a conducting layer electrically connected to a power supply terminal mounted on said base plate,
 said conductor enclosure forming an electric conductive layer for grounding,
 said intermediate conductor layer being apropriately formed with narrow parts and wider parts in its extension,
 coil parts being formed by said narrow parts, and capacitor parts being formed by said narrow parts, said wider parts, said insulating enclosure, and said conductor enclosure,
 said coil parts cooperating with said capacitor parts so as to constitute the equivalent of a low-pass filter on only one surface of said base plate.

2. A printed circuit device as claimed in claim 1 wherein one of said plurality of insulating layers is formed with an opening for exposing a part of an electric conductor layer beneath said one insulating layer, and said printed circuit further comprises an electrode layer printed on the surface of said one insulating layer and positioned, configured and dimensioned to be electrically connected to said certain electric conductor layer through said opening, at least one chip-formed element electrically and mechanically connected to said electrode layer, and a resistor layer printed on said electrode layer.

3. A printed circuit device as claimed in claim 1 wherein said base plate and said circuit pattern layer are formed with at least two through-holes each having an enlarged diameter part, one of said plurality of insulating layers is printed on the upper surface of a certain electric conductor layer in such a manner that a part of said certain electric conductor layer is exposed at said enlarged diameter part, and said printed circuit further comprises an electrode layer printed on the surface of said one insulating layer so as to be electrically connected to said certain electric conductive layer through said enlarged diameter part, and a circuit element with lead terminals which are disposed on the other surface of said base plate with the lead terminals thereof passed through said through-holes to project from the one surface of said base plate with each projecting part of the lead terminals electrically and mechanically connected to a corresponding predetermined part of said electrode layer.

4. A printed circuit device as claimed in claim 2 wherein said resistor layer is printed and formed on said one insulating layer, and the surface of said one insulating layer is flat over substantially the entire area of said base plate.

5. A printed circuit device as claimed in claim 1 further provided with an electrode layer formed on the other surface side of said base plate, and a circuit element with lead terminals disposed on the one surface of said base plate with each of the lead terminals thereof passed through a through-hole formed in said base plate and said circuit pattern layer projecting from the other surface of said base plate with each projecting part of the lead terminals electrically and mechanically connected to a corresponding predetermined part of said electrode layer at the other surface of said base plate, said electrode layer being connected to an electric conductor layer formed on said one surface of said base plate through said through-hole.

6. A printed circuit device as claimed in claim 1 wherein said electrical conductor layers are formed from a material containing, metal having a specific electric resistance of less than 10 microhm cm.

7. A printed circuit device as claimed in claim 6, wherein said metal is one selected from the group consisting of tungsten, molybdenum, and tungsten-molybdenum mixture.

8. A printed circuit device as claimed in claim 1 wherein said insulating layers are formed from a ceramic material.

9. A process for manufacturing a printed circuit, comprising the steps of printing a plurality of electric conductor layers and insulating layer in an alternate stacked laminar arrangement on one surface of a base plate to form a circuit pattern layer, said electric conductor layers and said insulating layers being formed by alternately printing electrically conductive material and insulating material in predetermined patterns and subjecting said materials thus printed to baking, said circuit pattern layer being made by printing at least two electric conductor layers in positions which result in their being arranged in facing relationship to each other printing a certain insulating layer between said conductor layers, disposing a power supply terminal on said printed circuit base plate, one of said two electric conductor layers being deposited with a first position, configuration, and dimension to form a conducting layer electrically connected to said power supply terminal, and the other electric conductor layer being deposited with a second position, configuration, and dimension to form an electric conductive layer for grounding, and said conducting layer deposited with said first configuration, dimension, and position cooperating with said certain insulating layer and said electric conductive layer for grounding.

* * * * *